(12) United States Patent
Suzuki et al.

(10) Patent No.: US 7,518,205 B2
(45) Date of Patent: Apr. 14, 2009

(54) SEMICONDUCTOR PACKAGE AND METHOD FOR MANUFACTURING THE SAME

(75) Inventors: Katsunori Suzuki, Hamamatsu (JP); Tetsutsugu Hamano, Iwata-gun (JP)

(73) Assignee: Yamaha Corporation, Shizuoka-Ken (JP)

( * ) Notice: Subject to any disclaimer, the term of this patent is extended or adjusted under 35 U.S.C. 154(b) by 687 days.

(21) Appl. No.: 11/074,747

(22) Filed: Mar. 9, 2005

(65) Prior Publication Data

US 2005/0214979 A1   Sep. 29, 2005

(30) Foreign Application Priority Data

Mar. 25, 2004   (JP) .............................. 2004-089141

(51) Int. Cl.
*H01L 31/0232*   (2006.01)
(52) U.S. Cl. ........................ 257/432; 257/433; 257/704; 257/E31.127
(58) Field of Classification Search ................. 257/432, 257/433, 444, 704, 710, E31.127
See application file for complete search history.

(56) References Cited

U.S. PATENT DOCUMENTS

| | | | | |
|---|---|---|---|---|
| 5,036,584 A | * | 8/1991 | Beauregard et al. | ............ 29/884 |
| 5,859,423 A | * | 1/1999 | Shimoyama et al. | ...... 250/214.1 |
| 6,844,606 B2 | * | 1/2005 | Logsdon et al. | ............. 257/434 |
| 7,180,164 B2 | * | 2/2007 | Aizawa et al. | ............... 257/686 |

FOREIGN PATENT DOCUMENTS

JP          10-007441          1/1998

* cited by examiner

*Primary Examiner*—Hoai v Pham
(74) *Attorney, Agent, or Firm*—Dickstein Shapiro LLP

(57) ABSTRACT

A semiconductor package has a substrate made of WCu, WAg, MoCu or MoAg. A plurality of leads are fixed to the substrate by hermetic sealing without an intervening nickel plating layer. A cover is bonded to the substrate with a seal ring which is directly bonded to the substrate by brazing without an intervening nickel plating layer. The leads are nickel plated and gold plated after hermetic sealing, and the seal ring is nickel plated and gold plated after brazing. Even though the substrate is made of a metal alloy, this arrangement provides the package with a high degree of air tightness.

5 Claims, 5 Drawing Sheets

SEMICONDUCTOR PACKAGE AND METHOD FOR MANUFACTURING THE SAME

BACKGROUND OF THE INVENTION

1. Field of the Invention

The present invention relates to a semiconductor package including a metal alloy substrate, a semiconductor device requiring a high degree of airtightness which is disposed on the substrate, a plurality of leads bonded to the substrate by hermetic sealing, and a sealing cover bonded to the substrate through a seal ring. The invention also relates to a method for manufacturing such a semiconductor package.

Priority is claimed on Japanese Patent Application No. 2004-89141, filed Mar. 25, 2004, the content of which is incorporated herein by reference.

2. Description of Related Art

A metal, hermetically sealed package is used for enclosing electronic components such as semiconductor devices which require a high degree of airtightness. Familiar examples include box-type butterfly packages, can-shaped stem-type packages (stem-type semiconductor carriers), and small, MiniDil-type packages. Lead wires or lead terminals, referred to collectively below as "leads," for carrying external electrical signals into the package (or carrier) are hermetically sealed at places where the leads enter the package (or carrier).

Such hermetic sealing is carried out to maintain an electrically insulated state between the metal package and the leads, and to airtightly seal the package interior. The metal substrate used in the metal package (carrier) is generally made of iron, stainless steel, iron-nickel alloy or the iron-nickel-cobalt alloy known by the trade name Kovar. These metals have sufficed for maintaining a high airtightness because of their good wettability with hermetic sealing glass and because they have a coefficient of thermal expansion similar to that of the glass.

Japanese Patent Publication No. 10-7441 (JP-A 10-7441) describes one technical approach for carrying out such hermetic sealing. In this prior art, a first metal layer made of nickel is formed on the surface of a metal terminal, then a second metal layer is formed on the nickel layer. During heat treatment, the nickel metal of which the first metal layer is made diffuses through the metal of the second metal layer, ultimately reaching the surface of these plating layers, where the nickel undergoes a redox reaction with glass, thereby forming a bonding layer. As a result, a strong hermetic seal can be achieved even on metal terminals having thereon a second metal layer to protect the surface.

However, with the increase over the past few years in the amount of heat generated by semiconductor devices, prior-art packaging materials are no longer capable of carrying out sufficient heat dissipation. Therefore, to prevent semiconductor device failure from heat generation by the device, tungsten-copper (WCu) alloys, tungsten-silver (Wag) alloys, molybdenum-copper (MoCu) alloys and molybdenum-silver (MoAg) alloys, all of which are endowed with a high heat conductivity and low thermal expansion characteristics, have come to be used as packaging materials in order to rapidly and efficiently dissipate the generated heat to the exterior. When a tungsten-copper alloy, tungsten-silver alloy, molybdenum-copper alloy or molybdenum-silver alloy is used as the substrate in a package (carrier), it has been necessary to braze a seal ring made of iron-nickel alloy or Kovar to the substrate in order to weld a cover (e.g., a lid or can) made of iron-nickel (FeNi) alloy or Kovar to the substrate.

When the seal ring made of iron-nickel alloy or Kovar is bonded to the substrate, the tungsten-copper alloy, tungsten-silver alloy, molybdenum-copper alloy or molybdenum-silver alloy is nickel-plated or otherwise pretreated to facilitate flow by the braze. In addition, heat treatment is carried out to increase adhesion between the substrate and the nickel plating. The leads are then hermetically sealed at lead entry points on the nickel-plated and heat-treated substrate, following which the seal ring is brazed to a predetermined position on the substrate.

However, because the metals making up the tungsten-copper alloy, tungsten-silver alloy, molybdenum-copper alloy or molybdenum-silver alloy are not mutually in solid solution, the surface condition of each of these alloys varies locally, which makes it difficult to induce uniform growth of the nickel plating. As a result, due to thermal excursions from heat treatment, the hermetic sealing step and the brazing after nickel plating, adhesion between the substrate and the nickel plating is degraded, making it difficult to maintain a high airtightness. Such packages (carriers) are thus unfit for housing semiconductor devices requiring a high degree of airtightness.

SUMMARY OF THE INVENTION

It is therefore an object of the present invention to provide a semiconductor package which, although having a substrate made of tungsten-copper (WCu) alloy, tungsten-silver (Wag) alloy, molybdenum-copper (MoCu) alloy or molybdenum-silver (MoAg) alloy, achieves a high degree of airtightness.

Accordingly, the present invention provides a semiconductor package comprising a substrate made of a metal alloy selected from the group including tungsten-copper alloys, tungsten-silver alloys, molybdenum-copper alloys and molybdenum-silver alloys, a semiconductor device requiring airtightness which is disposed on the substrate, a plurality of leads fixed to the substrate by hermetic sealing, and a sealing cover bonded to the substrate through a seal ring. To achieve the above objects, material for hermetic sealing for fixing the plurality of leads is bonded directly to the substrate without an intervening nickel plating layer, and the seal ring is directly bonded to the substrate by brazing without an intervening nickel plating layer. The leads are nickel plated and gold plated after hermetic sealing, and the seal ring is nickel plated and gold plated after brazing.

By using hermetic sealing to fix or bond the plurality of leads to the substrate without an intervening nickel plating layer, adhesion at the bond between the substrate and the hermetic glass and at the bonds between the leads and the hermetic glass does not decrease even when these hermetically sealed areas incur heat excursions. This structure enables a high degree of airtightness to be maintained. Moreover, because brazing is used to directly bond the seal ring to the substrate without an intervening nickel plating layer, adhesion where the substrate and the seal ring are brazed together does not decrease even when this brazed area is later subjected to heat excursions. This structure also enables a high degree of airtightness to be maintained. Semiconductor packages having a high degree of airtightness can thus be provided even though the substrate is made of a tungsten-copper alloy, tungsten-silver alloy, molybdenum-copper alloy or molybdenum-silver alloy.

Such semiconductor packages can be manufactured by a process which includes the steps of bonding the plurality of leads to the substrate by hermetic sealing, brazing the seal ring to the substrate, nickel plating and gold plating the leads after hermetic sealing, and nickel plating and gold plating the seal ring after brazing.

In this specification, "lead" refers to a package lead that may be either a wire or a terminal. Also, "package" and "carrier" are used interchangeably to refer to a semiconductor package.

BRIEF DESCRIPTION OF THE DRAWINGS

FIG. 7 is a schematic sectional view illustrating the condition in which a helium leak test is carried out on a package before the cap is welded on.

FIGS. 8A and 8B schematically show how a helium leak test is carried out on a semiconductor package after the cap is welded on.

DESCRIPTION OF THE PREFERRED EMBODIMENTS

The preferred embodiment of the present invention will be described below in conjunction with the drawings, although these embodiments are to be considered in all respects as illustrative and not limiting. Various modifications and changes may be made thereto without departing from the spirit and scope of the present invention.

[Fabrication of Substrate by Metal Injection Molding (MIM)]

First, 85W-15Cu (W:Cu=85:15 weight %) composite powder or mixed powder having an average particle size of 1.0 µm is charged into a jet mill or ball mill, and ground to an average particle size of 0.1 to 0.3 µm. Agglomerates that formed during pulverizing and powder spheroidization are removed. Size reduction in a jet mill is carried out at an applied pressure of 0.1 to 1 MPa and a speed of 5,000 rpm for 20 minutes. Size reduction in a ball mill is carried out for 20 to 200 hours.

Next, from 60 to 55 vol % of binder is added to 40 to 45 vol % of the resulting 85W-15Cu composite powder having an average particle size of 0.1 to 0.3 µm, and the mixture is kneaded. The binder is selected from among, for example, polypropylene (PP), polystyrene (PS), acrylic resins, and mixtures of a polyacetal (POM) and a wax. The resulting kneaded material is then pelletized with a pelletizer, and the pellets are charged into the hopper of an injection molding machine. Green bodies are then injection molded at 160° C. in an injection molding machine having a clamping pressure of 20 metric tons.

Next, debinding treatment is carried out by placing the green bodies in a debinding furnace, heating within a 1 L/min stream of nitrogen at a ramp-up rate of 0.1° C./min, then holding the temperature at 550° C. for 2 hours to volatize any binder remaining within the green bodies and cooling. The green bodies are then subject to deoxygenation by heating in a 1 L/min stream of hydrogen at a temperature of 500 to 1,000° C.; that is, below the melting point of copper. In this deoxygenation treatment, the oxide layer that had formed on the surface of the tungsten (W) particles is reduced with hydrogen, thereby enhancing wettability with copper (Cu).

Figure 1A:
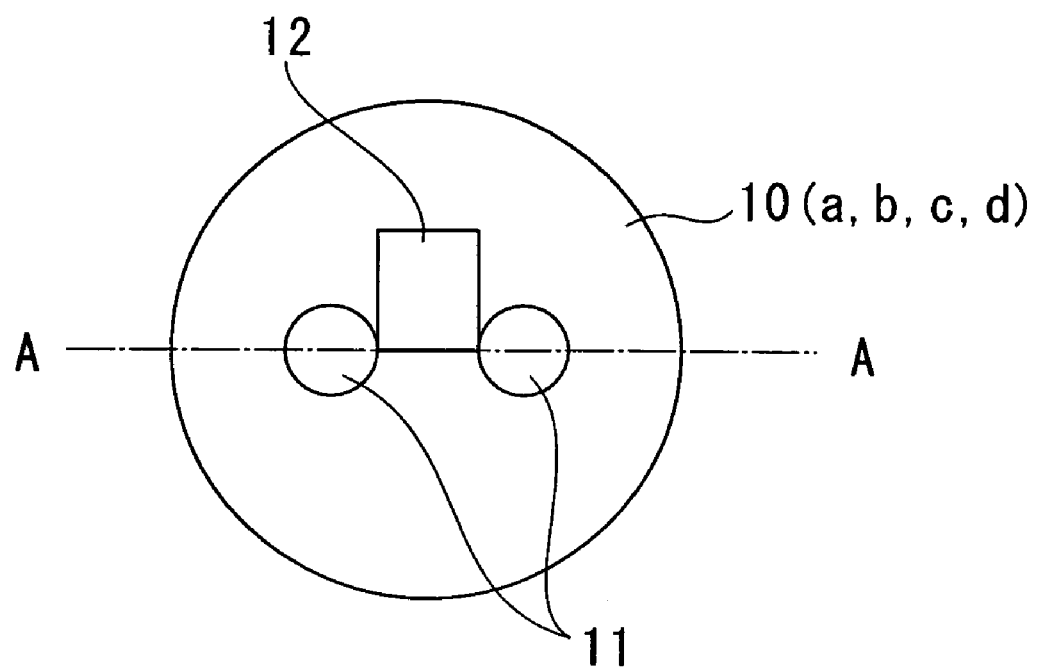
FIGS. 1A and 1B are a plan view and a sectional view taken along a line A-A in FIG. 1A, respectively, schematically showing a substrate for a stem-type LD module package according to an embodiment of the present invention.
Figure 1B:
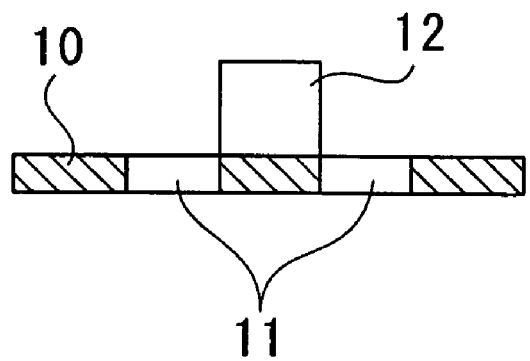

The green bodies are then placed in a sintering furnace, the temperature is ramped up at a rate of 5° C./min, and sintering is carried out at 1,175 to 1,225° C. in a stream of hydrogen, thereby completing the fabrication of a flat, circular substrate 10(a) having, as shown in FIGS. 1A and 1B, lead terminal feedthrough holes 11, a grounding terminal feedthrough hole (not shown), and a laser diode pad 12. In the sintering treatment described above, the sintering temperature when using 85W-15Cu is 1,175 to 1,225° C., but it is preferable for the sintering temperature to be 1,275 to 1,325° C. when 95W-5Cu (W:Cu=95:5 weight %) is used; 1,225 to 1,275° C. when 90W-10Cu (W:Cu=90:10 weight %) is used; 1,150 to 1,200° C. when 80W-20Cu (W:Cu=80:20 weight %) is used; and 1,125 to 1,175° C. when 70W-30Cu (W:Cu=70:30 weight %) is used.

Other than the above-described tungsten-copper (WCu) alloys, tungsten-silver (WAg) alloys, molybdenum-copper (MoCu) alloys and molybdenum-silver (MoAg) alloys may be used. In the present embodiment, using the same method as described above, substrates 10(b) are manufactured from the alloy powder of 85W-15Ag (W:Ag=85:15 weight %), substrates 10(c) are manufactured from the alloy powder of 85Mo-15Cu (Mo:Cu=85:15 weight %), and substrates 10(d) are manufactured from the alloy powder of 85Mo-15Ag (Mo:Ag=85:15 weight %).

[Semiconductor Carrier]

(1) EMBODIMENT OF THE INVENTION

Next, the substrates 10(a), 10(b), 10(c) or 10(d) manufactured as described above and lead terminals 14 made of iron-nickel (FeNi) alloy are placed in an oven heated to 350° C. and heat-treated at this temperature for 30 minutes, thereby oxidizing the surfaces of the substrates 10(a) to 10(d) and the surfaces of the lead terminals 14. This oxidation treatment enhances wettability with hermetic glass in the next step.

Figure 2A:
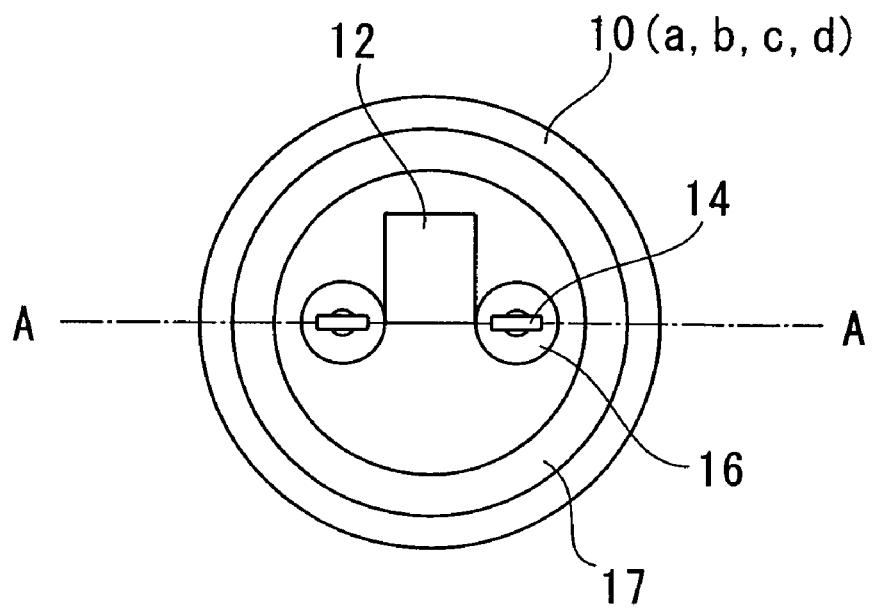
FIGS. 2A and 2B are a plan view and a sectional view taken along a line A-A in FIG. 2A, respectively, schematically showing the module package in process in which lead terminals are hermetically sealed to the substrate shown in FIGS. 1A and 1B, and a seal ring and ground terminal are brazed to the substrate according to the embodiment of the present invention.
Figure 2B:
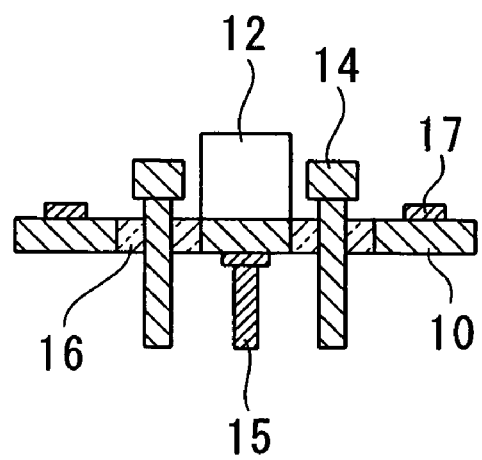

Next, cylinders of glass frit 16 for hermetic sealing are placed in the lead terminal feedthrough holes 11 in each oxidation treated substrate 10(a), 10(b), 10(c) and 10(d), and a lead terminal 14 was placed in each cylinder. The resulting assemblies are set in a carbon fixture (not shown) which is then loaded into a heat treatment furnace having a nitrogen atmosphere. This is followed by heating at a ramp-up of 50° C./min to a maximum temperature of 1,000° C. so as to melt the hermetic sealing glass frit 16, then cooling to room temperature at a rate of 30° C./min. The lead terminals 14 are thereby hermetically sealed in the lead terminal feedthrough holes 11 of each substrate 10(a), 10(b), 10(c) and 10(d), as shown in FIG. 2.

A seal ring 17 made of iron-nickel alloy or Kovar is then placed, over intervening braze (AgCu) 17a (see FIG. 5), at a predetermined position on each of the substrates 10(a) to 10(d). An iron-nickel alloy grounding terminal 15 is placed in the grounding terminal feedthrough hole (not shown) over intervening braze (AgCu), and the resulting assemblies are set in a carbon fixture (not shown). The carbon fixture is loaded into a heat treatment furnace having a hydrogen atmosphere, heated at a ramp-up rate of 50° C./min to a maximum temperature of 800° C. so as to melt the braze (AgCu), then cooled to room temperature at a rate of 30° C./min.

Figure 5:
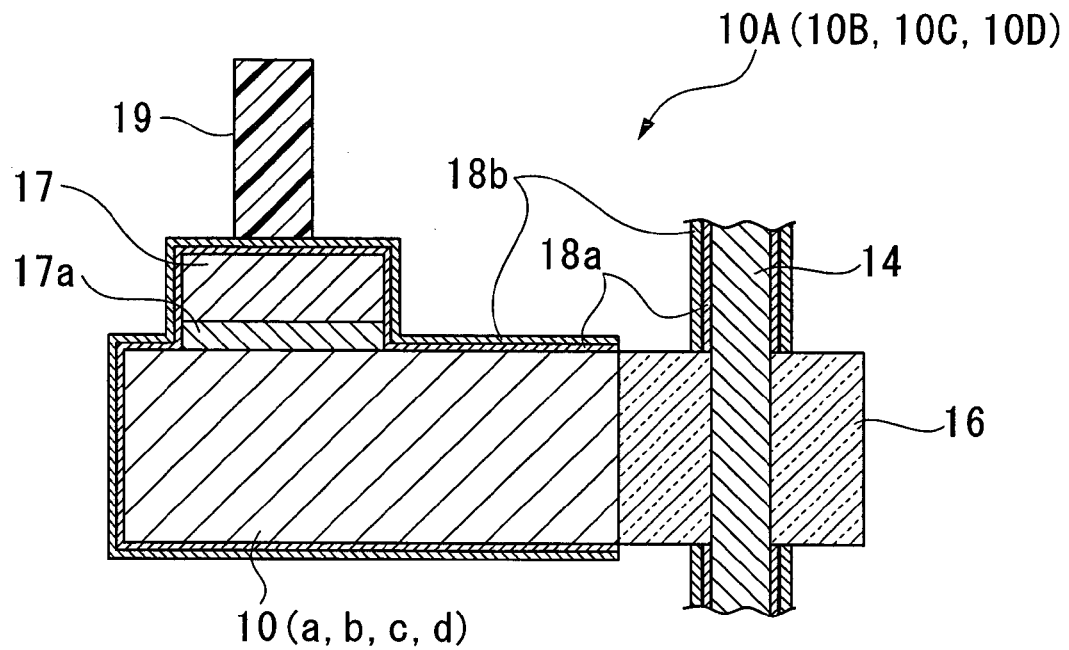
FIG. 5 is an enlarged sectional view showing a portion A shown in FIG. 4.

The resulting assemblies, in which the seal ring 17 was welded and secured at a predetermined position on each substrate 10(a) to 10(d) and the grounding terminal 15 was welded and secured to the grounding terminal feedthrough hole, are then immersed in a plating bath and nickel plated by an electroplating or electroless plating process, thereby forming a nickel plating layer 18a (see FIG. 5). Gold plating is then administered to the nickel plating layer 18a so as to form a gold plating layer 18b (FIG. 5). As of this, the respective semiconductor carriers 10a to 10d are produced, which are to be attached with semiconductor chip(s) and a cap. Here, the semiconductor carriers prior to cap welding thus obtained using the substrate 10(a) are labeled 10a, the semiconductor carriers obtained using the substrate 10(b) are labeled 10b, the semiconductor carriers obtained using the substrate 10(c) are labeled 10c, and the semiconductor carriers obtained using the substrate 10(d) are labeled 10d.

Figure 3A:
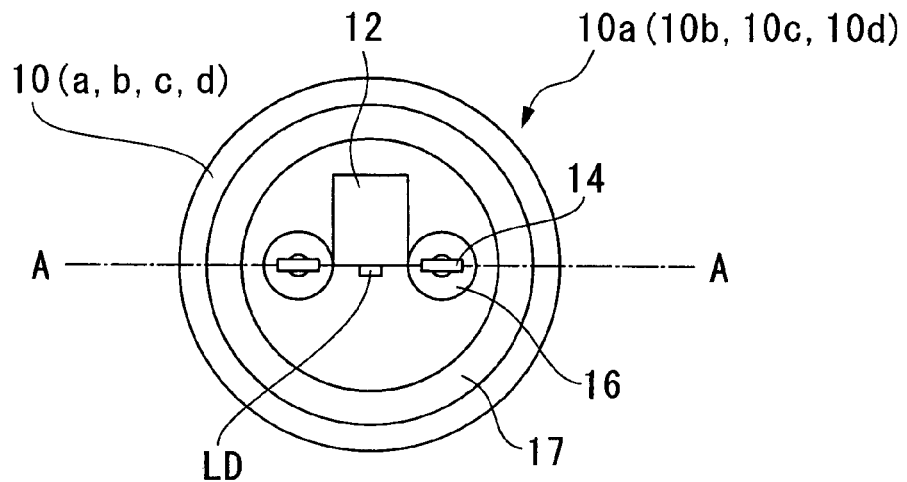
FIGS. 3A and 3B are a plan view and a sectional view taken along a line A-A in FIG. 3A, respectively, schematically showing the module package in process in which semiconductor devices are soldered to the parts shown in FIGS. 2A and 2B according to the embodiment of the present invention.
Figure 3B:
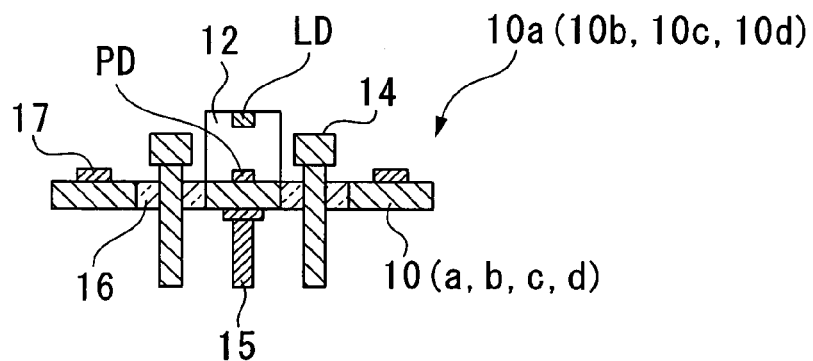

As shown in FIG. 3, a laser diode LD and a photodiode PD are then mounted on a sidewall of the laser diode pad 12 in each of these semiconductor carriers 10a, 10b, 10c and 10d prior to cap welding, following which lead wires (not shown) are connected to each of these diodes LD and PD.

Figure 4:
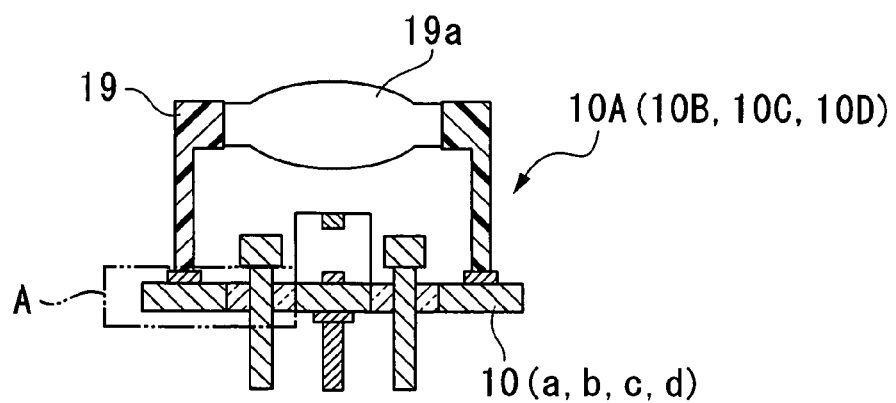
FIG. 4 is a sectional view schematically showing the LD module package with a cap welded to the parts shown in FIGS. 3A and 3B according to an embodiment of the present invention.

Next, as shown in FIG. 4, a cylindrical cap 19 provided at the top thereof with a lens 19a, after being set in a nitrogen atmosphere, is placed on top of the seal ring 17 of each of the semiconductor carriers and the two elements are resistance welded to form a stem-type LD module. Semiconductor carriers 10A (from 10a), 10B (from 10b), 10C (from 10c) and 10D (from 10d) are thus obtained.

(2) COMPARATIVE EXAMPLE

Figure 6:
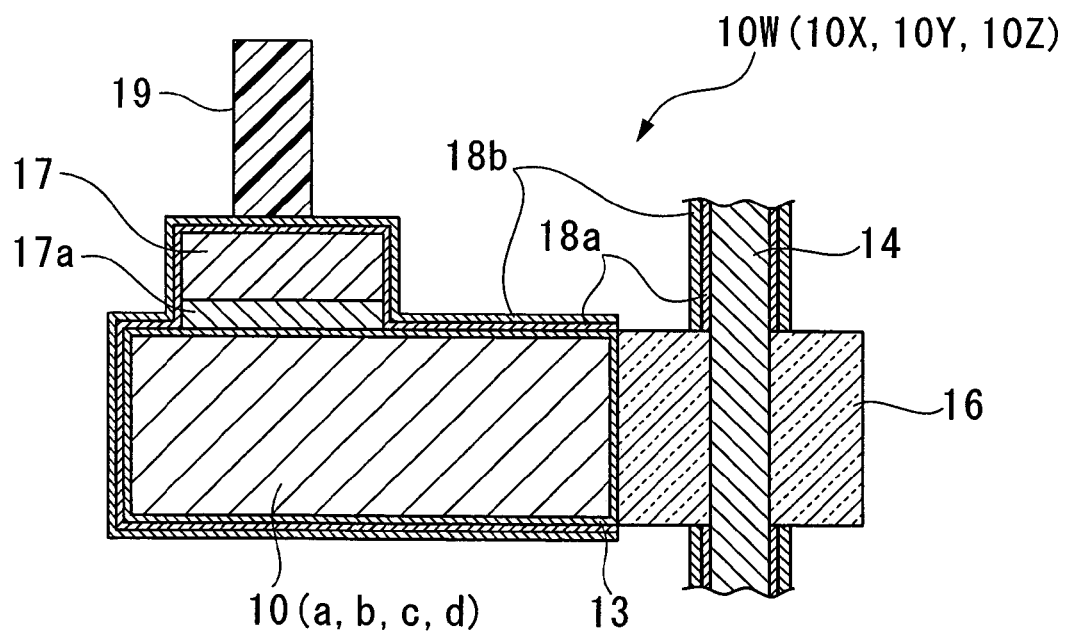
FIG. 6 is an enlarged sectional view showing a portion in a conventional module package in comparison with the portion A shown in FIG. 5.

Following the same procedure as described above with reference to the example of the invention, substrates 10(a), 10(b), 10(c) and 10(d) and iron-nickel (FeNi) alloy lead terminals 14 are placed in an oven heated to 350° C. and heat treated at this temperature for 30 minutes, thereby oxidizing the surfaces of the substrates 10(a) to 10(d) and the surfaces of the lead terminals 14. Next, as shown in FIG. 6, a nickel undercoat 13 is formed on the surface of each substrate 10(a) to 10(d) by a known plating method. This nickel undercoat 13 may be formed by electroplating in a sulfamic acid bath or Watt's nickel bath, or by electroless plating so as to deposit a layer of nickel-boron (Ni/B) alloy or nickel-phosphorus (Ni/P) alloy. After a nickel undercoat 13 was formed on the surface of the substrates 10(a) to 10(d), heat treatment is carried out to improve adhesion between the nickel undercoat 13 and the respective substrates 10(a) to 10(d).

Next, cylinders of glass frit 16 for hermetic sealing are placed in the lead terminal feedthrough holes 11 in each substrate 10a to 10d on which a nickel undercoat 13 was formed, and a lead terminal 14 is placed in each cylinder. The resulting assemblies are set in a carbon fixture (not shown) which is then loaded into a heat treatment furnace having a nitrogen atmosphere. This is followed by heating at a ramp-up rate of 50° C./min to a maximum temperature of 1,000° C. so as to melt the hermetic glass frit 16, then cooling to room temperature at a rate of 30° C./min. The lead terminals 14 are thereby hermetically sealed in the lead terminal feedthrough holes 11 of the respective substrates 10(a) to 10(d) over an intervening nickel undercoat 13.

A seal ring 17 made of iron-nickel alloy or Kovar is then placed, over intervening braze (AgCu) 17a, at a predetermined position on each of the substrates 10(a) to 10(d). An iron-nickel alloy grounding terminal 15 is placed in the ground terminal feedthrough hole (not shown) over intervening braze (AgCu), and the resulting assemblies are set in a carbon fixture (not shown). The carbon fixture is loaded into a heat treatment furnace having a hydrogen atmosphere, heated at a ramp-up rate of 50° C./min to a maximum temperature of 800° C. so as to melt the braze (AgCu), then cooled to room temperature at a ramp-down rate of 30° C./min.

The resulting assemblies, in which the seal ring 17 was welded and secured at a predetermined position on each substrate 10(a) to 10(d) having a nickel undercoat 13 formed thereon and the grounding terminal 15 was welded and secured to the grounding terminal feedthrough hole 11, are then immersed in a plating bath and nickel plated by an electroplating or electroless plating process, thereby forming a nickel plating layer 18a. Gold plating is then administered to the nickel plating layer 18a so as to form a gold plating layer 18b. As of this, the respective semiconductor carriers 10w to 10z are produced, which are to be attached with semiconductor chip(s) and a cap. Here, the semiconductor carriers prior to cap welding thus obtained using the substrates 10(a) are labeled 10w, the semiconductor carriers obtained using the substrates 10(b) are labeled 10x, the semiconductor carriers obtained using the substrate 10(c) are labeled 10y, and the semiconductor carriers obtained using the substrate 10(d) are labeled 10z.

As in the example of the invention described above, a laser diode LD and a photodiode PD are then mounted on a sidewall of the laser diode pad 12 in each of these semiconductor carriers 10w, 10x, 10y and 10z prior to cap welding, following which a lead wire was connected to each diode. A cylindrical cap 19 is then resistance welded to the seal ring 17 as in the above-described example of the invention to form a stem-type LD module. Comparative examples of semiconductor carriers 10W (from 10w), 10X (from 10x), 10Y (from 10y) and 10Z (from 10z) are thus obtained.

[Helium Leak Test]

(1) Before Cap Welding

Figure 7:
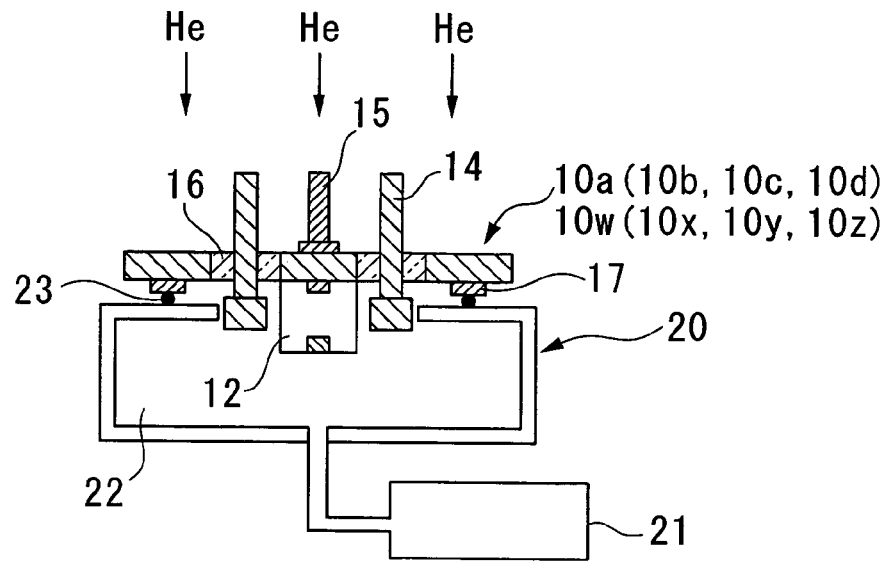

Helium leak tests were carried out on 15 specimens of each of the semiconductor carriers 10a to 10d and 10w to 10z prior to cap welding that were fabricated as described above. As shown in FIG. 7, the tests were conducted using a helium leak detector 20 (made by Shimadzu Corporation). In each test, the specimen (one of the semiconductor carriers 10a to 10d, and 10w to 10z) was placed over a test chamber 22 formed in the leak detector 20, with an O-ring 23 positioned therebetween.

Helium (He) gas was blown onto the semiconductor carriers 10a to 10d, and 10w to 10z. At the same time, helium gas that leaked through the semiconductor carriers and flowed into the test chamber 22 was drawn off into a helium detector 21. When the semiconductor carrier is not airtight, a greater amount of helium will enter the test chamber 22. The results obtained when this test was conducted on 15 specimens of each type of carrier are shown in Tables 1 to 4 below. Based on helium leak test standards for semiconductors, carriers having a helium leak rate of $5.0\times10^{-9}$ Pa.m³/sec or more were rated as unacceptable (NG).

TABLE 1 a. Tungsten-Copper (WCu) Alloy Substrate

| | Semiconductor carrier 10a | | | Semiconductor carrier 10w | |
|---|---|---|---|---|---|
| Specimen No. | He leak rate (Pa·m³/sec) | Rating | Specimen No. | He leak rate (Pa·m³/sec) | Rating |
| 1 | $2.9 \times 10^{-10}$ | OK | 1 | $2.6 \times 10^{-6}$ | NG |
| 2 | $2.8 \times 10^{-10}$ | OK | 2 | $4.2 \times 10^{-8}$ | NG |
| 3 | $3.0 \times 10^{-10}$ | OK | 3 | $2.5 \times 10^{-6}$ | NG |
| 4 | $3.0 \times 10^{-10}$ | OK | 4 | $2.5 \times 10^{-10}$ | OK |
| 5 | $2.7 \times 10^{-10}$ | OK | 5 | $2.1 \times 10^{-6}$ | NG |
| 6 | $2.5 \times 10^{-10}$ | OK | 6 | $1.6 \times 10^{-10}$ | OK |
| 7 | $2.7 \times 10^{-10}$ | OK | 7 | $5.8 \times 10^{-7}$ | NG |
| 8 | $2.6 \times 10^{-10}$ | OK | 8 | $2.6 \times 10^{-6}$ | NG |
| 9 | $2.6 \times 10^{-10}$ | OK | 9 | $2.6 \times 10^{-6}$ | NG |
| 10 | $2.4 \times 10^{-10}$ | OK | 10 | $2.6 \times 10^{-6}$ | NG |
| 11 | $2.4 \times 10^{-10}$ | OK | 11 | $6.6 \times 10^{-7}$ | NG |
| 12 | $2.6 \times 10^{-10}$ | OK | 12 | $1.2 \times 10^{-10}$ | OK |
| 13 | $2.8 \times 10^{-10}$ | OK | 13 | $3.4 \times 10^{-8}$ | NG |
| 14 | $2.9 \times 10^{-10}$ | OK | 14 | $2.6 \times 10^{-6}$ | NG |
| 15 | $2.7 \times 10^{-10}$ | OK | 15 | $7.8 \times 10^{-7}$ | NG |

TABLE 2 b. Tungsten-Silver (Wag) Alloy Substrate

| | Semiconductor carrier 10b | | | Semiconductor carrier 10x | |
|---|---|---|---|---|---|
| Specimen No. | He leak rate (Pa·m³/sec) | Rating | Specimen No. | He leak rate (Pa·m³/sec) | Rating |
| 1 | $2.7 \times 10^{-10}$ | OK | 1 | $3.0 \times 10^{-7}$ | NG |
| 2 | $2.6 \times 10^{-10}$ | OK | 2 | $6.6 \times 10^{-7}$ | NG |
| 3 | $2.9 \times 10^{-10}$ | OK | 3 | $2.5 \times 10^{-6}$ | NG |
| 4 | $2.6 \times 10^{-10}$ | OK | 4 | $2.5 \times 10^{-9}$ | OK |
| 5 | $2.6 \times 10^{-10}$ | OK | 5 | $2.1 \times 10^{-10}$ | OK |
| 6 | $2.7 \times 10^{-10}$ | OK | 6 | $1.6 \times 10^{-7}$ | NG |
| 7 | $2.8 \times 10^{-10}$ | OK | 7 | $2.5 \times 10^{-10}$ | OK |
| 8 | $2.8 \times 10^{-10}$ | OK | 8 | $2.6 \times 10^{-6}$ | NG |
| 9 | $3.1 \times 10^{-10}$ | OK | 9 | $2.6 \times 10^{-6}$ | NG |
| 10 | $3.5 \times 10^{-10}$ | OK | 10 | $2.6 \times 10^{-6}$ | NG |
| 11 | $2.8 \times 10^{-10}$ | OK | 11 | $1.6 \times 10^{-6}$ | NG |
| 12 | $2.4 \times 10^{-10}$ | OK | 12 | $5.2 \times 10^{-10}$ | OK |
| 13 | $2.5 \times 10^{-10}$ | OK | 13 | $4.4 \times 10^{-7}$ | NG |
| 14 | $2.1 \times 10^{-10}$ | OK | 14 | $5.6 \times 10^{-7}$ | NG |
| 15 | $2.7 \times 10^{-10}$ | OK | 15 | $9.8 \times 10^{-7}$ | NG |

TABLE 3 c. Molybdenum-Copper (MoCu) Alloy Substrate

| | Semiconductor carrier 10c | | | Semiconductor carrier 10y | |
|---|---|---|---|---|---|
| Specimen No. | He leak rate (Pa·m³/sec) | Rating | Specimen No. | He leak rate (Pa·m³/sec) | Rating |
| 1 | $3.7 \times 10^{-10}$ | OK | 1 | $3.0 \times 10^{-7}$ | NG |
| 2 | $2.6 \times 10^{-10}$ | OK | 2 | $6.6 \times 10^{-7}$ | NG |
| 3 | $2.6 \times 10^{-10}$ | OK | 3 | $2.6 \times 10^{-6}$ | NG |
| 4 | $2.6 \times 10^{-10}$ | OK | 4 | $2.5 \times 10^{-9}$ | OK |
| 5 | $4.6 \times 10^{-10}$ | OK | 5 | $2.1 \times 10^{-10}$ | OK |
| 6 | $2.7 \times 10^{-10}$ | OK | 6 | $1.6 \times 10^{-7}$ | NG |
| 7 | $2.8 \times 10^{-10}$ | OK | 7 | $2.5 \times 10^{-10}$ | OK |
| 8 | $2.8 \times 10^{-10}$ | OK | 8 | $2.6 \times 10^{-6}$ | NG |
| 9 | $2.4 \times 10^{-10}$ | OK | 9 | $6.6 \times 10^{-7}$ | NG |
| 10 | $2.3 \times 10^{-10}$ | OK | 10 | $2.6 \times 10^{-6}$ | NG |
| 11 | $2.6 \times 10^{-10}$ | OK | 11 | $2.5 \times 10^{-9}$ | OK |
| 12 | $3.4 \times 10^{-10}$ | OK | 12 | $5.2 \times 10^{-10}$ | OK |
| 13 | $2.5 \times 10^{-10}$ | OK | 13 | $4.4 \times 10^{-7}$ | NG |

TABLE 3-continued c. Molybdenum-Copper (MoCu) Alloy Substrate

| | Semiconductor carrier 10c | | | Semiconductor carrier 10y | |
|---|---|---|---|---|---|
| Specimen No. | He leak rate (Pa·m³/sec) | Rating | Specimen No. | He leak rate (Pa·m³/sec) | Rating |
| 14 | $2.1 \times 10^{-10}$ | OK | 14 | $5.6 \times 10^{-7}$ | NG |
| 15 | $6.7 \times 10^{-10}$ | OK | 15 | $8.8 \times 10^{-7}$ | NG |

TABLE 4 d. Molybdenum-Silver (MoAg) Alloy Substrate

| | Semiconductor carrier 10d | | | Semiconductor carrier 10z | |
|---|---|---|---|---|---|
| Specimen No. | He leak rate (Pa·m³/sec) | Rating | Specimen No. | He leak rate (Pa·m³/sec) | Rating |
| 1 | $1.7 \times 10^{-10}$ | OK | 1 | $1.0 \times 10^{-6}$ | NG |
| 2 | $2.8 \times 10^{-10}$ | OK | 2 | $6.6 \times 10^{-7}$ | NG |
| 3 | $2.8 \times 10^{-10}$ | OK | 3 | $2.6 \times 10^{-6}$ | NG |
| 4 | $3.1 \times 10^{-10}$ | OK | 4 | $2.5 \times 10^{-9}$ | OK |
| 5 | $3.5 \times 10^{-10}$ | OK | 5 | $2.1 \times 10^{-10}$ | OK |
| 6 | $2.8 \times 10^{-10}$ | OK | 6 | $1.6 \times 10^{-7}$ | NG |
| 7 | $2.4 \times 10^{-10}$ | OK | 7 | $2.5 \times 10^{-10}$ | OK |
| 8 | $2.8 \times 10^{-10}$ | OK | 8 | $2.6 \times 10^{-6}$ | NG |
| 9 | $2.4 \times 10^{-10}$ | OK | 9 | $6.6 \times 10^{-7}$ | NG |
| 10 | $2.3 \times 10^{-10}$ | OK | 10 | $2.6 \times 10^{-6}$ | NG |
| 11 | $2.6 \times 10^{-10}$ | OK | 11 | $2.5 \times 10^{-9}$ | OK |
| 12 | $3.4 \times 10^{-10}$ | OK | 12 | $5.2 \times 10^{-10}$ | OK |
| 13 | $2.7 \times 10^{-10}$ | OK | 13 | $4.4 \times 10^{-7}$ | NG |
| 14 | $2.8 \times 10^{-10}$ | OK | 14 | $5.6 \times 10^{-7}$ | NG |
| 15 | $3.7 \times 10^{-10}$ | OK | 15 | $8.8 \times 10^{-7}$ | NG |

As is apparent from the results in Tables 1 to 4 above, all 15 specimens of each type of the semiconductor carrier 10a to 10d according to the preferred embodiment of the invention had helium leak rates on the order of $10^{-10}$ Pa.m³/sec, indicating excellent airtightness. On the other hand, of the 15 specimens of each type of the semiconductor carrier 10w to 10z in the comparative example, ten or more ($\geqq 67\%$) had helium leak rates of at least $5.0\times10^{-9}$ Pa.m³/sec, indicating poor airtightness, and were thus rated as unacceptable.

This is because the semiconductor carriers 10w to 10z have a nickel undercoat 13 formed on the surface of the substrate 10(a), 10(b), 10(c) or (10d). Moreover, in tungsten-copper alloys, tungsten-silver alloys, molybdenum-copper alloys and molybdenum-silver alloys, the constituent metals are not in solid solution with each other. The surface state in each of these alloys thus varies locally, making it difficult to have the nickel undercoat 13 grow uniformly. As a result, thermal excursions such as in the hermetic sealing step or the brazing step presumably lower adhesion between the substrate 10(a), 10(b), 10(c) or 10(d) and the nickel undercoat 13. It makes a high degree of airtightness difficult to achieve.

By contrast, in semiconductor carriers 10a to 10d, the high degree of airtightness achieved in the hermetically sealed areas and in the areas where the seal ring 17 was brazed is most likely due to the fact that a nickel undercoat was not formed on the surface of the substrate 10(a), 10(b), 10(c) or 10(d).

(2) After Cap Welding

Figure 8A:
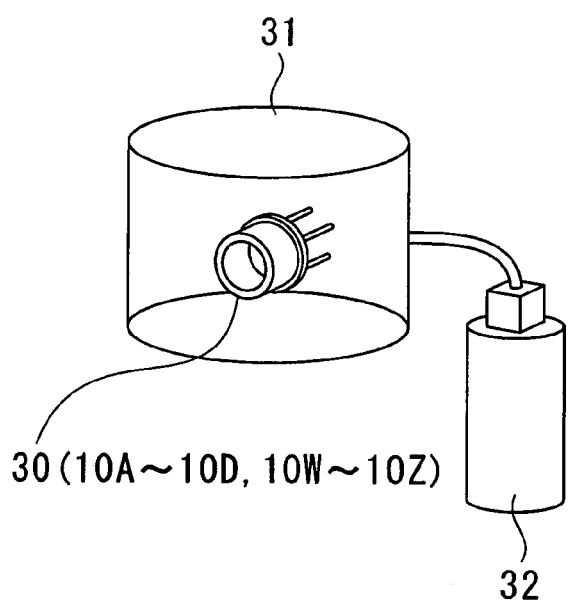

Helium leak tests were carried out on 15 specimens of each type of completed package 30 (the semiconductor carriers 10A to 10D, and 10W to 10Z) obtained by welding with the cap 19. In these helium leak tests, as shown in FIG. 8A, the specimen 30 (one of the semiconductor carriers 10A to 10D, and 10W to 10Z) was placed in a bombing chamber 31. The bombing chamber 31 was then filled with helium from a helium cylinder 32 at a pressure of 5 kg/cm² for 2 hours, after which the specimen 30 was removed from the bombing chamber 31.

Figure 8B:
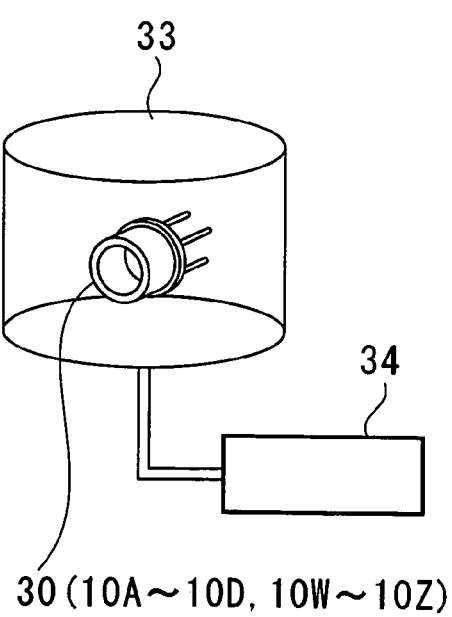

The specimen 30 was then placed in a bombing chamber 33 connected to a helium leak detector 34 (made by Shimadzu Corporation) as shown in FIG. 8B. The helium gas that filled the bombing chamber 33 was then drawn off, and the amount of helium which leaked from the specimen 30 was measured by the helium leak detector 34. The length of time from bombing pressurization until completion of helium leak measurement was set at not more than one hour. The leak test was carried out in accordance with JIS Z2330 and JIS Z2331. The results are given in Tables 5 to 8 below.

TABLE 5 a. Tungsten-Copper (WCu) Alloy Substrate

| | Semiconductor carrier 10A | | | Semiconductor carrier 10W | |
|---|---|---|---|---|---|
| Specimen No. | He leak rate (Pa · m³/sec) | Rating | Specimen No. | He leak rate (Pa · m³/sec) | Rating |
| 1 | $2.4 \times 10^{-10}$ | OK | 1 | $1.9 \times 10^{-10}$ | OK |
| 2 | $2.2 \times 10^{-10}$ | OK | 2 | $4.2 \times 10^{-9}$ | OK |
| 3 | $2.2 \times 10^{-10}$ | OK | 3 | $4.6 \times 10^{-9}$ | OK |
| 4 | $2.7 \times 10^{-10}$ | OK | 4 | $1.6 \times 10^{-8}$ | NG |
| 5 | $2.1 \times 10^{-10}$ | OK | 5 | $4.0 \times 10^{-8}$ | NG |
| 6 | $2.1 \times 10^{-10}$ | OK | 6 | $4.9 \times 10^{-9}$ | OK |
| 7 | $2.2 \times 10^{-10}$ | OK | 7 | $3.4 \times 10^{-10}$ | OK |
| 8 | $2.2 \times 10^{-10}$ | OK | 8 | $2.0 \times 10^{-9}$ | OK |
| 9 | $2.2 \times 10^{-10}$ | OK | 9 | $2.3 \times 10^{-9}$ | OK |
| 10 | $2.2 \times 10^{-10}$ | OK | 10 | $8.0 \times 10^{-8}$ | NG |
| 11 | $2.4 \times 10^{-10}$ | OK | 11 | $1.9 \times 10^{-7}$ | NG |
| 12 | $2.2 \times 10^{-10}$ | OK | 12 | $1.7 \times 10^{-10}$ | OK |
| 13 | $2.2 \times 10^{-10}$ | OK | 13 | $2.3 \times 10^{-8}$ | NG |
| 14 | $2.2 \times 10^{-10}$ | OK | 14 | $2.6 \times 10^{-9}$ | OK |
| 15 | $2.2 \times 10^{-10}$ | OK | 15 | $1.1 \times 10^{-7}$ | NG |

TABLE 6 b. Tungsten-Silver (Wag) Alloy Substrate

| | Semiconductor carrier 10B | | | Semiconductor carrier 10X | |
|---|---|---|---|---|---|
| Specimen No. | He leak rate (Pa · m³/sec) | Rating | Specimen No. | He leak rate (Pa · m³/sec) | Rating |
| 1 | $2.4 \times 10^{-10}$ | OK | 1 | $8.0 \times 10^{-8}$ | NG |
| 2 | $2.2 \times 10^{-10}$ | OK | 2 | $6.0 \times 10^{-8}$ | NG |
| 3 | $2.2 \times 10^{-10}$ | OK | 3 | $3.3 \times 10^{-8}$ | NG |
| 4 | $2.7 \times 10^{-10}$ | OK | 4 | $1.6 \times 10^{-8}$ | NG |
| 5 | $2.1 \times 10^{-10}$ | OK | 5 | $4.0 \times 10^{-8}$ | NG |
| 6 | $2.1 \times 10^{-10}$ | OK | 6 | $4.9 \times 10^{-9}$ | OK |
| 7 | $2.2 \times 10^{-10}$ | OK | 7 | $3.3 \times 10^{-9}$ | OK |
| 8 | $2.2 \times 10^{-10}$ | OK | 8 | $2.6 \times 10^{-6}$ | NG |
| 9 | $2.2 \times 10^{-10}$ | OK | 9 | $2.3 \times 10^{-9}$ | OK |
| 10 | $2.2 \times 10^{-10}$ | OK | 10 | $8.0 \times 10^{-8}$ | NG |
| 11 | $2.4 \times 10^{-10}$ | OK | 11 | $3.4 \times 10^{-10}$ | OK |
| 12 | $2.2 \times 10^{-10}$ | OK | 12 | $5.5 \times 10^{-10}$ | OK |
| 13 | $2.2 \times 10^{-10}$ | OK | 13 | $2.3 \times 10^{-8}$ | NG |
| 14 | $2.2 \times 10^{-10}$ | OK | 14 | $3.4 \times 10^{-10}$ | OK |
| 15 | $2.2 \times 10^{-10}$ | OK | 15 | $2.5 \times 10^{-7}$ | NG |

TABLE 7 c. Molybdenum-Copper (MoCu) Alloy Substrate

| | Semiconductor carrier 10C | | | Semiconductor carrier 10Y | |
|---|---|---|---|---|---|
| Specimen No. | He leak rate (Pa · m³/sec) | Rating | Specimen No. | He leak rate (Pa · m³/sec) | Rating |
| 1 | $2.4 \times 10^{-10}$ | OK | 1 | $8.0 \times 10^{-8}$ | NG |
| 2 | $2.6 \times 10^{-10}$ | OK | 2 | $6.0 \times 10^{-8}$ | NG |
| 3 | $2.7 \times 10^{-10}$ | OK | 3 | $6.6 \times 10^{-7}$ | NG |
| 4 | $4.6 \times 10^{-10}$ | OK | 4 | $2.6 \times 10^{-9}$ | OK |
| 5 | $2.8 \times 10^{-10}$ | OK | 5 | $2.6 \times 10^{-6}$ | NG |
| 6 | $2.4 \times 10^{-10}$ | OK | 6 | $6.6 \times 10^{-7}$ | NG |
| 7 | $2.4 \times 10^{-10}$ | OK | 7 | $2.6 \times 10^{-6}$ | NG |
| 8 | $2.4 \times 10^{-10}$ | OK | 8 | $2.5 \times 10^{-9}$ | OK |
| 9 | $2.7 \times 10^{-10}$ | OK | 9 | $2.6 \times 10^{-6}$ | NG |
| 10 | $2.8 \times 10^{-10}$ | OK | 10 | $2.6 \times 10^{-6}$ | NG |
| 11 | $4.8 \times 10^{-10}$ | OK | 11 | $2.6 \times 10^{-6}$ | NG |
| 12 | $2.2 \times 10^{-10}$ | OK | 12 | $1.6 \times 10^{-6}$ | NG |
| 13 | $2.2 \times 10^{-10}$ | OK | 13 | $5.2 \times 10^{-10}$ | OK |
| 14 | $2.2 \times 10^{-10}$ | OK | 14 | $5.6 \times 10^{-7}$ | NG |
| 15 | $2.4 \times 10^{-10}$ | OK | 15 | $6.5 \times 10^{-7}$ | NG |

TABLE 8 d. Molybdenum-Silver (MoAg) Alloy Substrate

| | Semiconductor carrier 10D | | | Semiconductor carrier 10Z | |
|---|---|---|---|---|---|
| Specimen No. | He leak rate (Pa · m³/sec) | Rating | Specimen No. | He leak rate (Pa · m³/sec) | Rating |
| 1 | $2.4 \times 10^{-10}$ | OK | 1 | $2.6 \times 10^{-6}$ | NG |
| 2 | $2.2 \times 10^{-10}$ | OK | 2 | $2.5 \times 10^{-9}$ | OK |
| 3 | $2.2 \times 10^{-10}$ | OK | 3 | $2.1 \times 10^{-10}$ | OK |
| 4 | $2.7 \times 10^{-10}$ | OK | 4 | $2.6 \times 10^{-6}$ | NG |
| 5 | $2.1 \times 10^{-9}$ | OK | 5 | $4.8 \times 10^{-10}$ | OK |
| 6 | $2.1 \times 10^{-10}$ | OK | 6 | $6.6 \times 10^{-7}$ | NG |
| 7 | $2.2 \times 10^{-10}$ | OK | 7 | $2.6 \times 10^{-6}$ | NG |
| 8 | $2.2 \times 10^{-10}$ | OK | 8 | $4.5 \times 10^{-9}$ | OK |
| 9 | $2.2 \times 10^{-10}$ | OK | 9 | $2.6 \times 10^{-6}$ | NG |
| 10 | $2.8 \times 10^{-10}$ | OK | 10 | $2.1 \times 10^{-10}$ | OK |
| 11 | $4.8 \times 10^{-10}$ | OK | 11 | $6.6 \times 10^{-6}$ | NG |
| 12 | $2.2 \times 10^{-10}$ | OK | 12 | $2.5 \times 10^{-10}$ | OK |
| 13 | $2.2 \times 10^{-10}$ | OK | 13 | $1.6 \times 10^{-6}$ | NG |
| 14 | $2.7 \times 10^{-10}$ | OK | 14 | $7.2 \times 10^{-10}$ | OK |
| 15 | $4.5 \times 10^{-10}$ | OK | 15 | $3.5 \times 10^{-7}$ | NG |

As is apparent from the results in Tables 5 to 8 above, all 15 specimens of each type of the semiconductor carrier 10A to 10D according to the preferred embodiment of the invention had helium leak rates on the order of $10^{-10}$ Pa.m³/sec, indicating excellent airtightness. On the other hand, of the 15 specimens of each type of the semiconductor carrier 10W to 10Z in the comparative example, six or more ($\geqq 40\%$) had helium leak rates of at least $5.0 \times 10^{-9}$ Pa.m³/sec, indicating poor airtightness, and were thus rated as unacceptable.

This is because the semiconductor carriers 10W to 10Z have a nickel undercoat 13 formed on the surface of the substrate 10(a), 10(b), 10(c) or 10(d). Moreover, in tungsten-copper alloys, tungsten-silver alloys, molybdenum-copper alloys and molybdenum-silver alloys, the constituent metals are not in solid solution with each other. The surface state in each of these alloys thus varies locally, making it difficult to have the nickel undercoat 13 grow uniformly. As a result, thermal excursions such as in the hermetic sealing step or the brazing step presumably lower adhesion between the substrate 10(a), 10(b), 10(c) or 10(d) and the nickel undercoat 13. It makes a high degree of airtightness difficult to achieve. By contrast, in the semiconductor carriers 10A to 10D, the high degree of airtightness achieved in the hermetically sealed areas and in the areas where the seal ring 17 is brazed is most likely due to the fact that a nickel undercoat is not formed on the surface of the substrate 10(*a*), 10(*b*), 10(*c*) or 10(*d*).

In the embodiment described above, a substrate made of tungsten-copper (WCu) alloy, tungsten-silver (Wag) alloy, molybdenum-copper (MoCu) alloy or molybdenum-silver (MoAg) alloy is produced by metal injection molding (MIM). However, the substrate is not restricted to be produced by the MIM process and may be made by other suitable processes. For example, a substrate may be made by an infiltration process in which a tungsten or molybdenum powder is pre-compressed and pre-sintered to form a porous body, following which the tungsten or molybdenum body is infiltrated with copper or silver. The resulting substrate can then be machined into a stem-type semiconductor carrier.

What is claimed is:

1. A semiconductor package comprising:
   a semiconductor device requiring airtightness which is disposed on a substrate; a plurality of leads fixed to said substrate by hermetic sealing; and a sealing cover bonded to said substrate through a seal ring, wherein:
   said substrate is made of a metal alloy selected from the group including tungsten-copper alloys, tungsten-silver alloys, molybdenum-copper alloys and molybdenum-silver alloys;
   material for said hermetic sealing is directly bonded to said substrate without an intervening nickel plating layer therebetween to fix said plurality of leads to said substrate;
   said seal ring is bonded to said substrate by brazing without an intervening nickel plating layer therebetween; and
   surfaces of said leads after said hermetic sealing and a surface of said seal ring after said brazing are nickel plated and gold plated.

2. A semiconductor package comprising:
   a substrate made of a tungsten-based metal alloys or molybdenum-based metal alloys and formed with a through hole;
   a lead located at said through hole and fixed to said substrate by hermetic sealing conducted directly to said substrate without any intervening layer between a inner wall of said through hole of said substrate and material for said hermetic sealing wherein exposed surfaces of said lead are nickel plated and gold plated;
   a semiconductor device requiring airtightness which is disposed on said substrate and connected to said lead; and
   a sealing cover bonded to said substrate to enclose said semiconductor device.

3. The semiconductor package as recited in claim 2 further comprising:
   a seal ring located between said substrate and said sealing cover for securely fixing said sealing cove to said substrate, said seal ring being bonded by brazing to said substrate without an intervening nickel plating layer.

4. The semiconductor package as recited in claim 2 wherein said tungsten-based metal alloys include tungsten-copper alloys and tungsten-silver alloys, and said molybdenum-based metal alloys include molybdenum-copper alloys and molybdenum-silver alloys.

5. The semiconductor package as recited in claim 2 wherein said semiconductor device includes a laser diode and a photo diode.

* * * * *